United States Patent
Pelley

(10) Patent No.: US 8,786,350 B1
(45) Date of Patent: Jul. 22, 2014

(54) TRANSMISSION SYSTEM

(71) Applicant: Perry H. Pelley, Austin, TX (US)

(72) Inventor: Perry H. Pelley, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/740,823

(22) Filed: Jan. 14, 2013

(51) Int. Cl.
*H03L 5/00* (2006.01)

(52) U.S. Cl.
USPC ............ 327/333; 327/108; 327/109; 327/112

(58) Field of Classification Search
USPC .................................. 327/108, 109, 112, 333
See application file for complete search history.

(56) References Cited

U.S. PATENT DOCUMENTS

| 5,475,635 | A | 12/1995 | Nogle |
| 6,828,841 | B2 | 12/2004 | Anders et al. |
| 2003/0193362 | A1* | 10/2003 | Kobayashi ................. 327/333 |
| 2007/0013356 | A1* | 1/2007 | Qiu et al. ................... 323/288 |

OTHER PUBLICATIONS

Feng, Z., et al., "Gate Controlled Vertical-Lateral NPN Bipolar Transistor in 90nm RF CMOS Process", IEEE BCTM, 2008, pp. 29-32.

* cited by examiner

*Primary Examiner* — John Poos
(74) *Attorney, Agent, or Firm* — James L. Clingan, Jr.; Mary Jo Bertani

(57) ABSTRACT

A signal transmission system (10) includes a signal generator circuit (12); a signal regenerator circuit (14) coupled to the signal generator circuit by conductive lines (16, 18). The signal regenerator circuit receives input signals from the signal generator circuit on the conductive lines, and the regenerator circuit includes cascoded transistors (39, 41) and level-shifting circuits (26) coupled to the cascoded transistors. The cascoded transistors amplify the input signals to provide amplified signals. The level-shifting circuits shift a voltage level of the amplified signals to provide level-shifted signals.

17 Claims, 1 Drawing Sheet

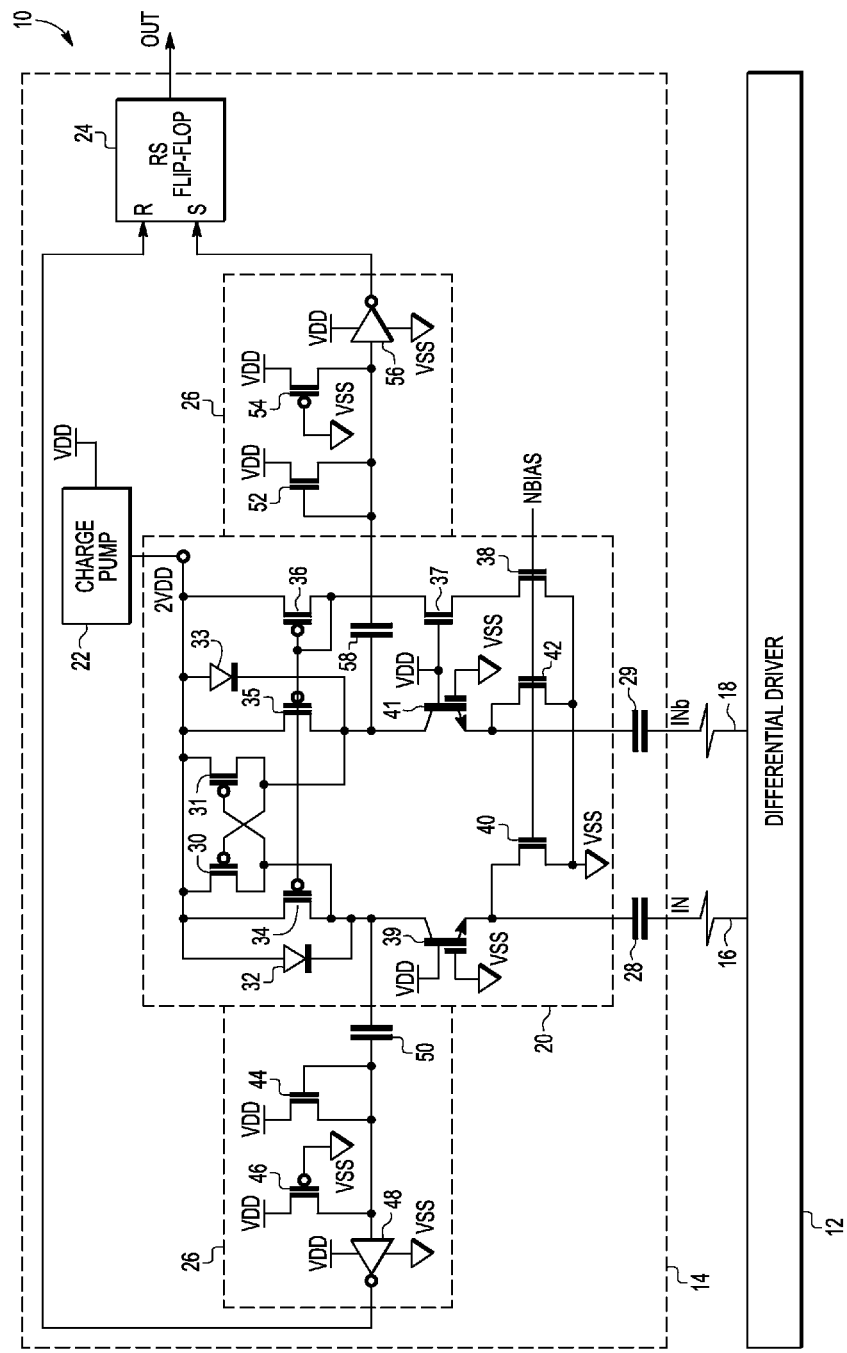

TRANSMISSION SYSTEM

BACKGROUND

1. Field

This disclosure relates generally to transmission systems, and more specifically, to transmissions systems using semiconductor devices.

2. Related Art

In a transmission system, there is typically one or more situations in which data is being transmitted over a relatively long distance. In the case of a semiconductor die, a long distance can be across a substantial portion of the die which would be likely measured in millimeters which is a long distance compared to typical distances that signals travel in semiconductor die which are more likely to be measured in microns. For these relatively long distances the capacitance of the lines across which the transmission is occurring is large compared to the drive capability. Also over the relatively long distance the resistance can be large because the lines are so thin so that the RC time constant is very detrimental to the speed with which the signal can be fully developed on the receiving end. This is a continuing struggle. The RC time constant limits the ability to improve the development speed of the signal by simply increasing the drive of the circuit that is sending the signal. The resistance can be decreased by increasing the size of the metal lines but the space may not be available and is likely to increase capacitance, increasing power consumption.

Thus, it is desirable to improve upon one or more of the issues raised above in the case of a signal that is being transmitted over a relatively long distance.

BRIEF DESCRIPTION OF THE DRAWINGS

The present invention is illustrated by way of example and is not limited by the accompanying FIGURES, in which like references indicate similar elements. Elements in the figures are illustrated for simplicity and clarity and have not necessarily been drawn to scale.

The FIGURE is a combination circuit diagram and block diagram of a transmission system according to an embodiment.

DETAILED DESCRIPTION

In one aspect a transmission system has a signal generator that provides a differential signal over a relatively long pair of lines to a regenerator. A pair of capacitors provide coupling between the regenerator and the signal generator. The regenerator provides a high gain by use of a bipolar pair of transistors that are configured in a high gain arrangement that is enabled by a collector voltage that is a higher voltage than the power supply voltage. The emitters are biased in a midrange that may be the power supply voltage. In such an arrangement a high gain is provided so that the received differential signal can be early in its development when the differential signal is still at a low level and not developing very rapidly. The high gain results in an output signal that is developed so that the data represented by the differential signal can be reliably stored at in a flip-flop powered at the power supply level. This is better understood by reference to the drawings and the following description.

Shown in the FIGURE is a transmission system 10 comprising a differential driver 12, a regenerator 14, a long distance line 16, and a long distance line 18. Long distance is long in the sense that the cumulative RC effect due to parasitic resistance and parasitic capacitance significantly degrades a signal that is being transmitted on those lines, especially relative to the speed requirements. Transmission system 10 may be on a single integrated circuit. Differential driver 12 is a signal generator that provides a true and complementary output so that the difference between the true and complementary outputs is what is detected by regenerator 14. Regenerator 14 has an input IN that is connected to line 16 and receives the true output of differential driver 12. The true signal may be referenced as signal IN. Regenerator 14 also has an input INb that is connected to line 18 and receives the complementary output of differential driver 12. The complementary signal may be referenced as signal INb. Differential driver 12 may be referenced as a signal generator circuit.

Regenerator 14 comprises a differential amplifier 20 that may also be referenced as a level shifting amplifier, a charge pump 22, an RS flip-flop 24, level shifting circuits 26, a capacitor 28, and a capacitor 29. Charge pump 22 is connected to a terminal VDD which is for receiving the regular power supply voltage used generally for the circuitry of the integrated circuit and has sufficient current capacity. The voltage received at power supply terminal VDD may be referenced as voltage VDD. Charge pump 22 uses voltage VDD to produce a voltage 2VDD that is approximately twice that of voltage VDD. This output terminal where voltage 2VDD is supplied is referenced as terminal 2VDD. Capacitor 28 has a first terminal connected to input IN and a second terminal. Capacitor 29 has a first terminal connected to input INb and a second terminal. Differential amplifier 20 comprises P channel transistor 30, P channel transistor 31, a diode 32, a diode 33, a P channel transistor 34, a P channel transistor 35, a P channel transistor 36, a P channel 37, and a P channel transistor 38, an NPN transistor 39, an NPN transistor 41, an N channel transistor 40, and an N channel transistor 42. Because it generally preferable for this type of circuit to be of MOS transistors, NPN transistors 39 and 41 can conveniently made as lateral NPN transistors that can be made using MOS processes which results in them having a terminal that is made in the same manner as a gate of an MOS transistor. This terminal is conveniently connected to ground, as is the case for bipolar transistors 39 and 41 as shown in the FIGURE, in the case of the intended operation being as an NPN transistor. Using this type of bipolar transistor makes it significantly more cost effective to have bipolar transistors on the integrated circuit than to add a bipolar process module to the MOS process. Level shifting circuits 26 comprise an N channel transistor 44, a P channel transistor 46, an inverter 48, a capacitor 50, an N channel transistor 52, a P channel transistor 54, an inverter 56, and a capacitor 58.

For level shifting amplifier 20, P channel transistor 30 has a source connected to terminal 2VDD, a gate, and a drain. P channel transistor 31 has a source connected terminal 2VDD, a gate connected to the drain of P channel transistor 30, and a drain connected to the gate of P channel transistor 30. Diode 32 has an anode connected to terminal 2VDD and a cathode connected to the drain of P channel transistor 30. Diode 33 has an anode connected to terminal 2VDD and a cathode connected to the drain of P channel transistor 31. NPN transistor 41 has a collector connected to the drain of P channel transistor 30, a base connected to terminal VDD, and an emitter connected to the second terminal of capacitor 28. NPN transistor 39 has a collector connected to the drain of P channel transistor 31, a base connected to terminal VDD, and an emitter connected to the second terminal of capacitor 29. The inputs of level shifting amplifier 20 are the emitters of transistors 39 and 41. The outputs of level shifting amplifier 20 are the collectors of transistors 39 and 41. Transistor 39 has the true input and output. Transistor 41 has the complementary input and output. Transistor 40 has a drain connected to the emitter of transistor 38, a gate connected to a bias signal NBIAS, and a source connected to a terminal VSS which is the negative power supply terminal and may be ground. Transistor 42 has a drain connected to the emitter of transistor 41, a gate connected to bias signal NBIAS, and a source connected to terminal VSS. P-channel transistors 34, 35, and 36 have a sources coupled to terminal 2VDD and gates coupled to the drain of transistor 36. The drain of transistor 34 is coupled to the collector of transistor 36, and the drain of transistor 35 is coupled to the collector of transistor 38. The source of N-channel cascode transistor 37 is coupled to the drain of transistor 36. The gate of transistor 37 is coupled to VDD while the source is coupled to the drain of transistor 38. The source of transistor 38 is coupled to VSS and the gate is coupled to NBIAS.

For level shifter 26, capacitor 50 has a first terminal connected to the collector of transistor 39 and a second terminal. N channel transistor 44 has a gate and a first current electrode connected to the second terminal of capacitor 50 and a second current electrode connected to terminal VDD. P channel transistor 46 has a source connected to terminal VDD, a gate connected to terminal VSS, and a drain connected to the second terminal of capacitor 50. Inverter 48, which is powered between terminals VDD and VSS, has an input connected to the second terminal of capacitor 50 and an output to an R input of RS flip-flop 24. Inverter 48 provides a complementary output due to a single inversion from the emitter of transistor 39, which carries the true of signal IN, to the output of inverter 48. Capacitor 50, transistors 44 and 46, and inverter 48 can be considered a first portion of level shifter 26. Capacitor 58 has a first terminal connected to the collector of transistor 41 and a second terminal. N channel transistor 52 has a gate and a first current electrode connected to the second terminal of capacitor 58 and a second current electrode connected to terminal VDD. P channel transistor 54 has a source connected to terminal VDD, a gate connected to terminal VSS, and a drain connected to the second terminal of capacitor 58. Inverter 56, which is powered between terminals VDD and VSS, has an input connected to the second terminal of capacitor 58 and an output coupled to the S input of RS flip-flop 24. Inverter 56 provides a true output due to a single inversion from the emitter of transistor 39, which carries the complement derived from signal INb, to the output of inverter 56. Capacitor 58, transistors 52 and 54, and inverter 56 can be considered a second portion of level shifter 26. Transistors 39 and 41 are in a cascode arrangement and thus may sense very small signals on their emitters and effectively isolate the signal on their collectors from the high capacitance of long distance lines 16 and 18 for fast switching.

In operation, transistors 40 and 42, by having a voltage of NBIAS on their gates, serve as current sources to bias the emitters of transistors 39 and 41 to a nominal voltage of a diode drop below voltage VDD below their base voltage of VDD. The degree to which transistors 39 and 41 supply current is achieved on the basis of the size of transistors 40 and 42 and the voltage level of bias signal NBIAS. Preferably, they are marginally conductive. Transistors 34 and 35 can supply substantially more current than transistors 40 and 42 so that the collectors of transistor 39 and 41 are near a potential of 2VDD in a steady state condition. The currents of transistors 34 and 35 are set by current source transistors 38 and 36. Transistor 37 protects the drain of transistor 38 from a voltage breakdown. The current of transistors 46 and 54 ensure the steady state condition of the input to inverters 48 and 56, respectively, will be a logic high so that both inverters 48 and 56 output a logic low to RS flip flop 24. With both inputs set to a logic low, RS flip flop 24 is a stable condition and retains the previous output. In the steady state condition, signals IN and INb remain in a neutral state at a nominal VBE below VDD. In the steady state condition, transistors 30 and 31 are non-conductive. Transistors 44 and 52 prevent the inputs to inverters 48 and 56 respectively from coupling more than an N-channel Vt above VDD.

When the differential input, IN and INb, changes, during normal switching, the complementary signals IN and INb will switch logic states. The example of input IN switching from a logic low to a logic high and input INb switching from a logic high to a logic high will be explained. The proper response is that output of RS flip-flop should switch from a logic low to a logic high. As input INb begins lowering in voltage, the voltage on the emitter of transistor 41 will follow. After a drop of a few tenths of a volt, the emitter of transistor 41 will drop sufficiently so that base to emitter current begins flowing to cause a rapid drop in the voltage on the collector of transistor 41. The increase in signal IN will tend to raise the voltage on the emitter of transistor 39 and will ensure that it becomes non-conductive. This rapid drop of the voltage on the collector of transistor 41 is transferred to the input of inverter 56 through capacitor 58. Load transistors 30 and 31 supply a faster complementary rising edge in response to a falling edge on the collectors of transistor 39 and 41. In this example a more rapid rising edge on the collector of transistor 39 is supplied in response to the rapidly falling collector of transistor 41. This rapid drop of the voltage on the collector of transistor 41, through capacitor 58, will cause inverter 56 to switch from providing a logic low output to a logic high output. With a positive signal on input IN, the transistor 39 remains non-conductive. Further transistor 30 is conductive due to the drop in the voltage on its gate to the drop in voltage on the drain of transistor 31. Diode 33 becomes conductive when the voltage on the drain of transistor 41 drops more than a diode drop below voltage 2VDD, which keeps transistor 41 from going into saturation. Bipolar transistors are slow to respond to a logic state change when in saturation. Diodes 32 and 33 are thereby present to avoid this slow response time situation. Inverter 56 switches a to a logic high and inverter 48 remains at a logic low so that RS flip flop 24 switches to providing a logic high output indicative that differential driver 12 has provided a logic high input. After the inputs IN and INB have stopped transitioning, the input to inverter 56 begins reverting back to voltage VDD, a logic high, due to the operation of transistor 54 which is tending to raise the voltage on the input of inverter 56. When the input to inverter 56 reaches the switch point of inverter 56, inverter 56 switches to a logic low output. In such case, RS flip-flop is in the hold condition so that the output of RS flip flop is retained and in this case RS flip-flop 24 keeps providing a logic high output. The drop in voltage on the emitter of transistor 41 also begins reducing until the desired bias is present. The hold condition will remain until there is a logic state change in inputs IN and INb.

For a logic transition to a logic low for Input IN and to a logic high for input INb, the emitter of transistor 39 begins dropping while the emitter of transistor 41 begins rising, causing transistor 39 to conduct more current and transistor 41 to stop conducting current at all. This in turn causes the collector of transistor 39 to drop in voltage sufficiently to very rapidly cause inverter 48 to switch to providing a logic high to cause flip-flop 24 to switch its output to a logic low. The input to inverter 56 is retained at a logic high so that a logic low output to RS flip-flop 24 is retained. After the transition, the emitters and collectors of transistors 39 and 41 and the inputs of inverters 48 and 56 return to the potentials of the steady state condition. Since the input to inverters 48 and 56 are a logic high, both inputs to the RS flip-flop are at a logic low which is the hold condition which retains the output at its current condition. Transistors 46 and 54 supply sufficient current that the inputs to inverters 48 and always return to approximately VDD With faster signals on IN and INb there may not be time a steady state condition to be reached for transistor 39 and 41 collectors and emitters. Instead the regenerator 14 may immediately switch to the opposite logic state. Under these conditions transistors 44 and 52 prevent the inputs to inverters 48 and 56 respectively from coupling more than an N-channel Vt above VDD.

Thus it is shown that a pair cascoded bipolar transistors can be used to provide a level shift to a higher voltage to place the bipolar transistors in a condition where a small signal can be sensed with high gain and that level shifter can shift back to the lower voltage for logic operations utilizing the gain provided by the level-shifting cascoded bipolar transistors. The use of the RS flip-flop allows for the output to be retained indefinitely. This can be particularly useful in mode change situations where it is important to rapidly communicate mode changes over all or major portions of an integrated circuit.

Although the invention is described herein with reference to specific embodiments, various modifications and changes can be made without departing from the scope of the present invention as set forth in the claims below. For example, other voltages may be used than those described and intervening elements may be utilized where connections are described. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

By now it should be apparent that a signal transmission system has been disclosed that includes a signal generator circuit and a signal regenerator circuit in which the signal regenerator circuit is coupled to the signal generator circuit by conductive lines with parasitic resistance and capacitance The signal regenerator circuit receives input signals from the signal generator circuit on the conductive lines. Further, the signal regenerator circuit includes cascoded transistors and level-shifting circuits coupled to the cascoded transistors, wherein the cascoded transistors amplify the input signals to provide amplified signals and the level-shifting circuits shift a voltage level of the amplified signals to provide level-shifted signals. The system may have a further characterization by which the signal regenerator circuit further includes a plurality of capacitors, each of the capacitors coupled to a respective one of the conductive lines between the signal generator circuit and the cascoded transistors. The system may further include a first supply voltage coupled to control operation of the cascoded transistors and a charge pump coupled to the signal regenerator circuit to provide a second supply voltage to the signal regenerator circuit, wherein the second supply voltage is greater than the first supply voltage. The system may have a further characterization by which the signal regenerator circuit may further include a headroom voltage circuit coupled to the cascoded transistors. The system may have a further characterization by which the signal regenerator circuit may further include saturation limit circuitry coupled to the headroom voltage circuit. The system may have a further characterization by which the signal regeneration circuit may further include a headroom voltage circuit coupled between the charge pump and the cascoded transistors. The system may have a further characterization by which the cascoded transistors are lateral NPN bipolar transistors. The system may have a further characterization by which the signal regenerator circuit further includes a flip-flop circuit coupled to receive the level-shifted signals and provide an output signal from the signal regenerator circuit. The system may have a further characterization by which the level-shifting circuits include a first capacitor, an input to the first capacitor is coupled between a voltage headroom circuit and the cascoded transistors, an N-channel transistor having a source coupled to a supply voltage and a gate and a drain coupled to an output of the first capacitor, a P-channel transistor having a source coupled to a supply voltage and a gate and a drain coupled to the output of the first capacitor, and an inverter having an input coupled to the output of the first capacitor and an output no greated than a voltage level of the first supply voltage. The system may have a further characterization by which the signal regenerator circuit further includes a bias circuit coupled the cascoded transistors.

Disclosed also is a signal transmission system having a pair of amplifying transistors. The signal transmission system further includes a pair of transmission lines, wherein each of the transmission lines is coupled to provide input signals to a respective one of the amplifying transistors. The signal transmission system further includes a pair of level-shifting circuits, each of the level-shifting circuits coupled to a respective one of the amplifying transistors, wherein the level-shifting circuits reduce voltage of amplified signals from the amplifying transistors. The system may further include saturation limiting circuitry coupled to the voltage headroom circuit. The system may further include a pair of capacitors, wherein each of the capacitors is coupled between a respective one of the amplifying transistors and the level-shifting circuits. The system may have a further characterization by which the level-shifting circuits include an N-channel transistor having a source coupled to a supply voltage and a gate and a drain coupled to an output of a first capacitor, a P-channel transistor having a source coupled to a supply voltage and a gate and a drain coupled to the output of the first capacitor, and an inverter having an input coupled to the output of the first capacitor. The system may further include a pair of capacitors, wherein each of the capacitors is coupled between a respective one of the amplifying transistors and the transmission lines. The system may have a further characterization by which the amplifying transistors are lateral bipolar transistors, the voltage headroom circuit includes first and second P-channel transistors with a gate of the first P-channel transistor coupled to a drain of the second P-channel transistor, and a gate of the second P-channel transistor coupled to a drain of the first P-channel transistor. The system may further include a charge pump coupled to provide a first voltage to the voltage headroom circuit, wherein the first voltage is greater than a supply voltage provided to the amplifying transistors.

Also disclosed is a method of repeating a transmitted signal that includes receiving a pair of differential signals from a driver circuit. The method further includes generating amplified signals by amplifying the differential signals using respective amplifying transistors, wherein headroom voltage coupled to a current electrode of each of the amplifying transistors is greater than a supply voltage coupled to gates of the amplifying transistors. The method further includes adjusting voltage levels of the amplified signals to the supply voltage. The method may have a further characterization by which the amplifying transistors are one of a group consisting of: cascoded lateral bipolar transistors, cascoded bipolar transistors, and cascoded metal oxide semiconductor (MOS) transistors.

What is claimed is:

1. A signal transmission system comprising:
   a signal generator circuit;
   a signal regenerator circuit coupled to the signal generator circuit by conductive lines with parasitic resistance and capacitance, wherein
      the signal regenerator circuit receives input signals from the signal generator circuit on the conductive lines, and
      the signal regenerator circuit includes cascoded transistors, level-shifting circuits coupled to the cascoded transistors, and a plurality of capacitors, wherein;
         the cascoded transistors amplify the input signals to provide amplified signals;
         the level-shifting circuits shift a voltage level of the amplified signals to provide level-shifted signals; and
         each of the plurality of capacitors is coupled to a respective one of the conductive lines between the signal generator circuit and the cascoded transistors.

2. The system of claim 1, further comprising:
   a first supply voltage coupled to control operation of the cascoded transistors;
   a charge pump coupled to the signal regenerator circuit to provide a second supply voltage to the signal regenerator circuit, wherein the second supply voltage is greater than the first supply voltage.

3. A signal transmission system comprising:
   a signal generator circuit;
   a signal regenerator circuit coupled to the signal generator circuit by conductive lines with parasitic resistance and capacitance, wherein
      the signal regenerator circuit receives input signals from the signal generator circuit on the conductive lines, and
      the signal regenerator circuit includes cascoded transistors, a headroom voltage circuit coupled to the cascoded transistors, and level-shifting circuits coupled to the cascoded transistors, wherein the cascoded transistors amplify the input signals to provide amplified signals and the level-shifting circuits shift a voltage level of the amplified signals to provide level-shifted signals.

4. The system of claim 3, the signal regenerator circuit further comprising:
   saturation limit circuitry coupled to the headroom voltage circuit.

5. The system of claim 2, the signal regenerator circuit further comprising:
   a headroom voltage circuit coupled between the charge pump and the cascoded transistors.

6. The system of claim 1, wherein the cascoded transistors are lateral NPN bipolar transistors.

7. The system of claim 1, wherein the signal regenerator circuit further includes a flip-flop circuit coupled to receive the level-shifted signals and provide an output signal from the signal regenerator circuit.

8. The system of claim 2, wherein the level-shifting circuits comprise:
   a first capacitor, an input to the first capacitor is coupled between a voltage headroom circuit and the cascoded transistors;
   an N-channel transistor having a source coupled to a supply voltage and a gate and a drain coupled to an output of the first capacitor;
   a P-channel transistor having a source coupled to a supply voltage and a gate and a drain coupled to the output of the first capacitor; and
   an inverter having an input coupled to the output of the first capacitor and an output no greater than a voltage level of the first supply voltage.

9. The system of claim 1, wherein the signal regenerator circuit further includes a bias circuit coupled the cascoded transistors.

10. A signal transmission system, comprising:
    a pair of amplifying transistors;
    a pair of transmission lines, wherein each of the transmission lines is coupled to provide input signals to a respective one of the amplifying transistors;
    a pair of level-shifting circuits, each of the level-shifting circuits coupled to a respective one of the amplifying transistors, wherein the level-shifting circuits reduce voltage of amplified signals from the amplifying transistors; and
    a voltage headroom circuit coupled to the pair of amplifying transistors.

11. The system of claim 10, further comprising:
    saturation limiting circuitry coupled to the voltage headroom circuit.

12. A signal transmission system, comprising:
    a pair of amplifying transistors;
    a pair of transmission lines, wherein each of the transmission lines is coupled to provide input signals to a respective one of the amplifying transistors;
    a pair of level-shifting circuits, each of the level-shifting circuits coupled to a respective one of the amplifying transistors, wherein the level-shifting circuits reduce voltage of amplified signals from the amplifying transistors;
    a pair of capacitors, wherein each of the capacitors is coupled between a respective one of the amplifying transistors and the level-shifting circuits; and
    a pair of capacitors, wherein each of the capacitors is coupled between a respective one of the amplifying transistors and the level-shifting circuits.

13. The system of claim 10, wherein the level-shifting circuits comprise:
    an N-channel transistor having a source coupled to a supply voltage and a gate and a drain coupled to an output of a first capacitor;
    a P-channel transistor having a source coupled to a supply voltage and a gate and a drain coupled to the output of the first capacitor; and
    an inverter having an input coupled to the output of the first capacitor.

14. The system of claim 10, further comprising:
a pair of capacitors, wherein each of the capacitors is coupled between a respective one of the amplifying transistors and the transmission lines.

15. The system of claim 10, wherein the amplifying transistors are lateral bipolar transistors, the voltage headroom circuit includes first and second P-channel transistors with a gate of the first P-channel transistor coupled to a drain of the second P-channel transistor, and a gate of the second P-channel transistor coupled to a drain of the first P-channel transistor.

16. The system of claim 10, further comprising:
a charge pump coupled to provide a first voltage to the voltage headroom circuit, wherein the first voltage is greater than a supply voltage provided to the amplifying transistors.

17. A method of repeating a transmitted signal comprising:
receiving a pair of differential signals from a driver circuit;
generating amplified signals by amplifying the differential signals using respective cascoded amplifying transistors, wherein headroom voltage coupled to a current electrode of each of the amplifying transistors is greater than a supply voltage coupled to gates of the amplifying transistors and the differential signals are capacitively coupled to the cascoded amplifying transistors; and
adjusting voltage levels of the amplified signals to the supply voltage.

\* \* \* \* \*